United States Patent
Kothandaraman et al.

(10) Patent No.: US 7,485,944 B2
(45) Date of Patent: Feb. 3, 2009

(54) PROGRAMMABLE ELECTRONIC FUSE

(75) Inventors: Chandrasekharan Kothandaraman, Hopewell Junction, NY (US); Subramanian Iyer, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,058

(22) Filed: Oct. 21, 2004

(65) Prior Publication Data

US 2006/0087001 A1 Apr. 27, 2006

(51) Int. Cl.
*H01L 23/525* (2006.01)

(52) U.S. Cl. ............. 257/529; 257/209; 257/E23.149

(58) Field of Classification Search ............ 257/529, 257/173, 209, 665, E23.149
See application file for complete search history.

(56) References Cited

U.S. PATENT DOCUMENTS

| | | | | |
|---|---|---|---|---|
| 3,699,395 | A | * | 10/1972 | Boleky .................. 361/805 |
| 3,959,047 | A | | 5/1976 | Alberts et al. |
| 4,064,493 | A | | 12/1977 | Davis |
| 4,420,504 | A | * | 12/1983 | Cooper et al. .............. 438/601 |
| 5,420,456 | A | | 5/1995 | Galbi et al. |
| 5,636,372 | A | | 6/1997 | Hathaway et al. |
| 5,854,510 | A | * | 12/1998 | Sur et al. .................. 257/529 |
| 6,040,223 | A | * | 3/2000 | Liu et al. .................. 438/303 |
| 6,096,580 | A | | 8/2000 | Iyer et al. |
| 6,141,245 | A | | 10/2000 | Bertin et al. |
| 6,239,455 | B1 | * | 5/2001 | Becker et al. ............... 257/209 |
| 6,323,535 | B1 | | 11/2001 | Iyer et al. |
| 6,346,846 | B1 | | 2/2002 | Bertin et al. |
| 6,388,305 | B1 | | 5/2002 | Bertin et al. |
| 6,396,120 | B1 | | 5/2002 | Bertin et al. |
| 6,396,121 | B1 | | 5/2002 | Bertin et al. |
| 6,433,404 | B1 | | 8/2002 | Iyer et al. |
| 6,498,056 | B1 | | 12/2002 | Motsiff et al. |
| 6,570,207 | B2 | | 5/2003 | Hsu et al. |
| 6,577,156 | B2 | | 6/2003 | Anand et al. |
| 6,621,324 | B2 | | 9/2003 | Fifield et al. |
| 6,624,031 | B2 | | 9/2003 | Abadeer et al. |
| 6,624,499 | B2 | | 9/2003 | Kothandaraman et al. |
| 6,633,055 | B2 | | 10/2003 | Bertin et al. |
| 6,661,330 | B1 | * | 12/2003 | Young ..................... 337/297 |

(Continued)

OTHER PUBLICATIONS

"Electrically Programmable Fuse (eFUSE) Using Electromigration in Silicides" C. Kothandaraman, Sundar K. Iyer, M, IEEE Electron Deivce Letters, vol. 23, No. 9, Sep. 2002, pp. 523-525.

(Continued)

*Primary Examiner*—Marcos D. Pizarro
(74) *Attorney, Agent, or Firm*—Scully, Scott, Murphy & Presser, P.C.; Joseph P. Abate, Esq.

(57) ABSTRACT

A programmable device (eFuse), includes: a substrate (10); an insulator (13) on the substrate; an elongated semiconductor material (12) on the insulator, the elongated semiconductor material having a first end (12a), a second end (12b), a fuse link (11) between the ends, and an upper surface S. The semiconductor material includes a dopant having a concentration of at least 10*17/cc. The first end (12a) is wider than the second end (12b), and a metallic material is disposed on the upper surface. The metallic material is physically migratable along the upper surface responsive to an electrical current I flowable through the semiconductor material and through the metallic material.

3 Claims, 11 Drawing Sheets

U.S. PATENT DOCUMENTS

| | | |
|---|---|---|
| 6,710,640 B1 | 3/2004 | Kothandaraman et al. |
| 6,753,590 B2 | 6/2004 | Fifield et al. |
| 6,794,726 B2 | 9/2004 | Radens et al. |
| 6,879,021 B1 | 4/2005 | Fitfield et al. |
| 6,882,027 B2 | 4/2005 | Brintzinger et al. |
| 6,972,614 B2 | 12/2005 | Anderson, II et al. |
| 2004/0004268 A1 | 1/2004 | Brown et al. |
| 2004/0051162 A1 | 3/2004 | Chidambarrao et al. |
| 2006/0060938 A1 | 3/2006 | Abadeer et al. |
| 2006/0102982 A1 | 5/2006 | Park et al. |
| 2006/0108662 A1 | 5/2006 | Kothandaraman et al. |
| 2006/0128071 A1 | 6/2006 | Rankin et al. |
| 2006/0131743 A1 | 6/2006 | Erickson et al. |
| 2006/0136751 A1 | 6/2006 | Bonaccio et al. |
| 2006/0136858 A1 | 6/2006 | Erickson et al. |

OTHER PUBLICATIONS

U.S. Appl. No. 10/604,414, filed Jul. 18, 2003, Entitled "Method for Reduced Electrical Fusing Time", Darren L. Anand, et al. IBM Ref: BUR920020093US1.

U.S. Appl. No. 10/711,748, filed Oct. 1, 2004, Entitled "High Voltage ESD Power Clamp", Christopher S. Putnam, et al. IBM Ref.: BUR920040050US1.

* cited by examiner

TABLE 1          eFUSE - EFFECT OF LENGTH

| TYPE OF FUSE | NOMINAL LENGTH $L(\mu m)$ | CURRENT $I(mA)$ | R BEFORE ($\Omega$) | R AFTER ($\Omega$) | POWER DENSITY $I^2R/L$ |
|---|---|---|---|---|---|
| LONG | 2.4 | 10 | 141 | 8.46E+06 | 5.88E-03 |
| LONG | 2.4 | 5 | 150 | 5.60E+04 | 1.56E-03 |
| INTERMEDIATE | 1.2 | 10 | 83 | 6.49E+09 | 6.92E-03 |
| INTERMEDIATE | 1.2 | 5 | 85.6 | 3.32E+09 | 1.78E-03 |
| SHORT | 0.24 | 10 | 36 | 3.56E+01 | 1.50E-02 |
| SHORT | 0.24 | 5 | 35.4 | 3.52E+01 | 3.69E-03 |

THE FUSE WIDTH IN ALL CASES 0.12 $\mu m$

FIG. 14a

TABLE 2

| PARAMETER | MINIMUM | NOMINAL | MAXIMUM |
|---|---|---|---|
| POLY-SILICON THICKNESS ($T_{poly}$) | 60 nm | 120 nm | 250 nm |
| STI-OXIDE THICKNESS ($T_{STI}$) | 70 nm | 200-350 nm | 500 nm |
| SILICIDE THICKNESS ($T_{SILICIDE}$) | 10 nm | 20 nm | 30 nm |
| SILICIDE MATERIALS (BOTH SALICIDE AND POLYCIDE) | | $CoSi_2, NiSi$ | |
| P+ DOPANT (B OR BF2) | $10^{17}/cm^3$ | $10^{20}/cm^3$ | $10^{21}/cm^3$ |
| SILICIDE NITRIDE (COVERS THE FUSE, MAY BE COMPRESSIVE, TENSILE OR UNSTRESSED | 20 nm | 50 nm | 80 nm |

FIG. 14b

TABLE 3

| FUSE SHAPE | MINIMUM | NOMINAL | MAXIMUM |
|---|---|---|---|
| FUSE WIDTH ($W_{link}$) (TECH MIN + 1 GRID POINT) | 0.045 μm | 0.09 μm | 0.5 μm |
| FUSE LINK ($\ell$) | 5 X ($W_{link}$) | 10 X ($W_{link}$) | 15 X ($W_{link}$) |
| CATHODE WIDTH ($W_{cathode}$) | 5 X ($W_{link}$) | 10 X ($W_{link}$) | 15 X ($W_{link}$) |
| ANODE WIDTH ($W_{anode}$) | 1 X ($W_{link}$) | 3 X ($W_{link}$) | 5 X ($W_{link}$) |

FIG. 14c

PROGRAMMABLE ELECTRONIC FUSE

TECHNICAL FIELD

The present invention relates to programmable semiconductor devices and, more particularly, to such devices usable as semiconductor electronic fuses (eFuses).

BACKGROUND ART

Semiconductor eFuses in general are known. The word fuse or eFuse will be used interchangeably in this specification. Specifically, eFuse in this application refers to fuses that increase the resistance of a circuit path when subjected to a programming current.

However, known eFuses have not proven to be entirely satisfactory. Programming in, for example, silicon-based semiconductor devices (e.g., fuses) can result in post collateral damage of neighboring structures. This result typically forces a fuse pitch, or fuse cavity, set of rules that do not scale well with the technology feature rules from one generation to the next. Thus, fuse density and effectiveness of fuse repair, replacement, or customization are limited. Typically, such damage is caused by particulates from fuse blow. Another class of fuses having a high resistance from an unprogrammed state change to a programmed state having a low resistance, is known as "antifuse". See, for example, U.S. Pat. No. 5,334,880, Low Voltage Programmable Storage Element, by Abadeer, et al., which is incorporated here in its entirety.

Semiconductor chips typically have many fuses depending on the particular device; the number of fuses can range from tens to thousands. Such fuses contain an initial resistance distribution of $R0 \pm \Delta R0$, and a programmed resistance distribution of $Rp \pm \Delta Rp$. The $\pm \Delta Rp$ causes fuse read instability because this parameter is statistical in nature. The variations that cause the R0 and Rp distributions to approach each other cause practical limitations in interrogating a programmed fuse through a standard CMOS latching circuit. To overcome these limitations, the prior art has included (for example) additional fuses as reference elements in order to discriminate between a programmed and an unprogrammed fuse. Such practices result in unwanted growth in the fuse bank area.

SUMMARY OF THE INVENTION

The present invention overcomes this and other drawbacks by employing a device or fuse structure of composite layers of materials that migrate by a specific type of physical diffusion process under an applied current. This differs from the melting or vaporizing type common with many known fuses during a programming event. The material (e.g., $CoSi_2$ or $NiSi_2$) that visually migrates (mostly by electromigration) causes the change in the resistance of the fuse, while not causing collateral damage during its migration or material reformation, and has a programmed state where $\pm \Delta Rp$ is preferably small and close to zero (i.e the programmed fuse resistances are tightly distributed). Thus, the present invention allows for individual fuses to discriminate among themselves on the basis of programming and to eliminate unwanted reference fuse elements, as well as the circuitry used to bias and compare against the reference fuse elements. A "reliable" eFuse technology in this application means a fuse structure and/or programming methodology that result in a large population of eFuses to achieve a programmed resistance objective (greater than some resistance value or a nominal value and a sigma etc.) without melting or other process that can cause collateral damage.

Figure 1A:
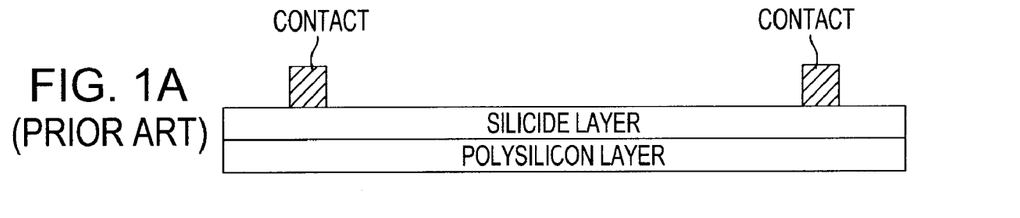
FIG. 1a and FIG. 1b are the top and cross sectional views of a prior art generic polysilicon Fuse.
Figure 1B:
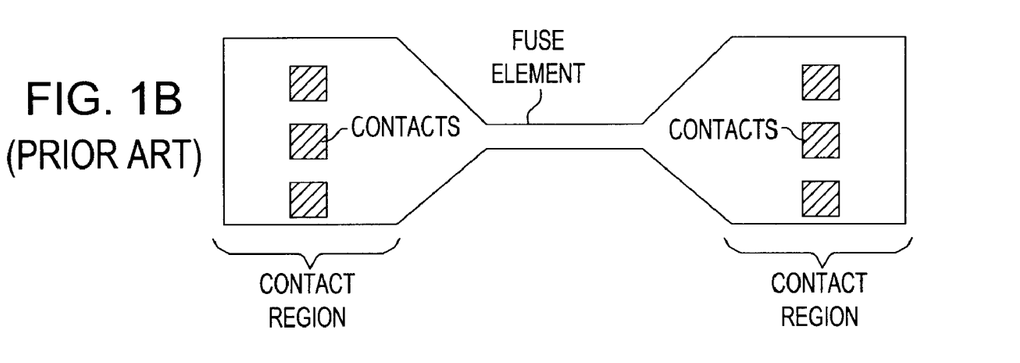
Figures 2A, 2B:
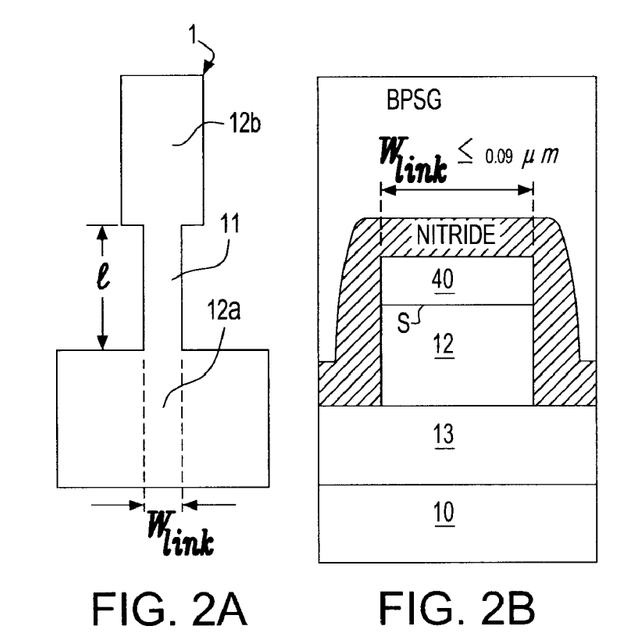
FIG. 2a and FIG. 2b are top and cross sectional views of a preferred embodiment of an eFuse according to the present invention.

FIGS. 1A and 1B show a known generic fuse with a narrow and uniform middle portion, referred to as a fuse link or a fuse element, and wider fuse end parts which are contact regions. The fuse end parts are shown as symmetrical, but alternatively can be asymmetrical. The fuse has an underlying polysilicon layer and an overlying silicide layer. FIG. 2a shows a top view and FIG. 2b shows a cross sectional view of a fuse or programmable device according to one preferred embodiment of the present invention. According to a preferred embodiment of the present invention, a programmable device includes a semiconductor substrate (10); an insulator (13) on the substrate; an elongated semiconductor material (12) on the insulator, the elongated semiconductor material having first and second ends, a link region (11) and an upper surface S; the first end (12a) being substantially wider than the second end (12b), and a metallic material (40) on/at the upper surface, said metallic material being physically migratable along the upper surface responsive to an electrical current I passing through the elongated semiconductor material and the metallic material. Preferably, a nitride or other suitable barrier material is disposed on the surfaces of the fuse. The semiconductor material 12 is doped with p or n type impurities which have a concentration of at least $10^{17}$/cc. Dopant concentrations equal to or greater than $10^{17}$/cc provide the reliability and other benefits of the present invention.

U.S. Pat. Nos. 6,008,523, 6,432,760, 6,433,404 and 6,624,499 discuss aspects of an eFuse, relevant to the present invention. The patents are assigned to the the assignee of the present application, and are fully incorporated herein. U.S. Pat. No. 6,642,601 teaches a specific eFuse improvement, and in particular teaches the use of thinner layers in the fuse link regions as compared to the rest of the fuse. The disadvantage of this eFuse ('601) is that in order to create such a structure, additional process steps including mask levels and lithographic processes are required.

A method of programming an eFuse according to the present invention includes flowing an electrical current I through the fuse having a metallic material such as a semiconductor alloy (40) disposed on a doped semiconductor line (12), for a time period such that a portion of the semiconductor alloy migrates from a first end (12a) of the device to a location proximate to a second end (12b) of the device. Further, the inventors believe that the dopants in portions of the doped semiconductor line 12 are removed during the programming cycle enabling a high final resistance.

The applicants of the present invention discovered that several parameters determine if the fuse will be a reliable eFuse. Such parameters include, for example, fuse geometry, resistance of the layers, thickness of the layers, electrode shapes, programming current and type of insulator coatings. The applicants believe that the effect or influence of these parameters on device operation can be unexpected. See, for example, "Electrically Programmable Fuse (eFuse) Using Electromigration in Silicides" by Kothandaraman, et al., *IEEE Electron Device Letters*, Vol 23, No. 9, September 2002, which is incorporated in it entirety herein.

Accordingly, it is an object of the present invention to provide a method of fabricating a reliable programmable eFuse, which method is readily compatible with various standard MOS manufacturing processes, including those used for DRAM and Logic devices.

An additional object of the present invention is to provide a method of programming an eFuse which reduces collateral damages to neighboring structures.

Another object of the present invention is to provide a reliable eFuse design that can be programmed using low voltages of 5 volts and less.

Still another object of the present invention is to establish structural parameters for a reliable eFuse.

Further and still other objects of the present invention will become more readily apparent when the following detailed description is taken in conjunction with the accompanying drawings.

BRIEF DESCRIPTION OF THE DRAWINGS

FIG. 3a' and FIG. 3b' show top and side schematic views corresponding to FIG. 3a and FIG. 3b; but showing the periphery P of the depleted region as smooth or regular, rather than ragged or irregular as shown in FIG. 3a and FIG. 3b, and showing the depleted regions as more circular than the shapes (eg., semicircles) or concavities shown in FIG. 3a and FIG. 3b, FIG. 4a and FIG. 4b show the silcide migration behavior when fuses with 90 nm and 45 nm links are programmed using current less than 1 crit.

FIGS. 14a, b, c show that comparable post-program resistances can result from either Cobalt silicide or Nickel silicide as the layer 40:

DETAILED DESCRIPTION OF THE PREFERRED EMBODIMENTS AND BEST MODE

Figure 2C:
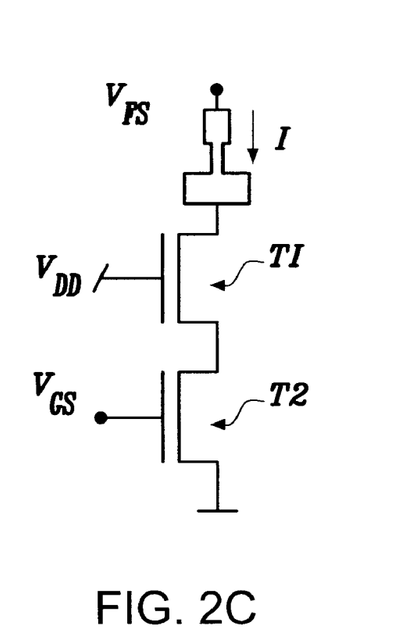
FIG. 2c is a schematic diagram of a circuit used for programming the eFuse of the present invention.

FIG. 2a is a top view of a fuse according to the present invention, wherein the fuse ends 12a, 12b are asymmetrical. The fuse link portion has an approximately (±10%) uniform width W. Following the terminology used in semiconductor technologies, a square is used to denote a film of equal width and length; the fuse length can be viewed as made of several squares of the fuse material. The nominal minimum width W of the fuse link corresponds to the technology node scale used. For example, if one uses 90 nm technology then the nominal width W of the fuse link 11 is therefore 90 nm. FIG. 2b shows a cross sectional view of the fuse and its placement (for example) in a CMOS semiconductor chip. The fuse link is situated over an insulator, in this case over an isolation oxide (13). The fuse itself includes a bottom layer 12 of polysilicon and a top layer 40 of metallic material. Preferably, the cathode (12a) and the anode (12b) have dissimilar shapes and have larger cross sections than the fuse link (11). FIG. 2c shows a programming circuit including two cascaded NFETs; the FET (T1) being connected to the fuse electrode and tied to VDD while the other FET (T2) is pulsed with a programming signal.

Figure 3A:
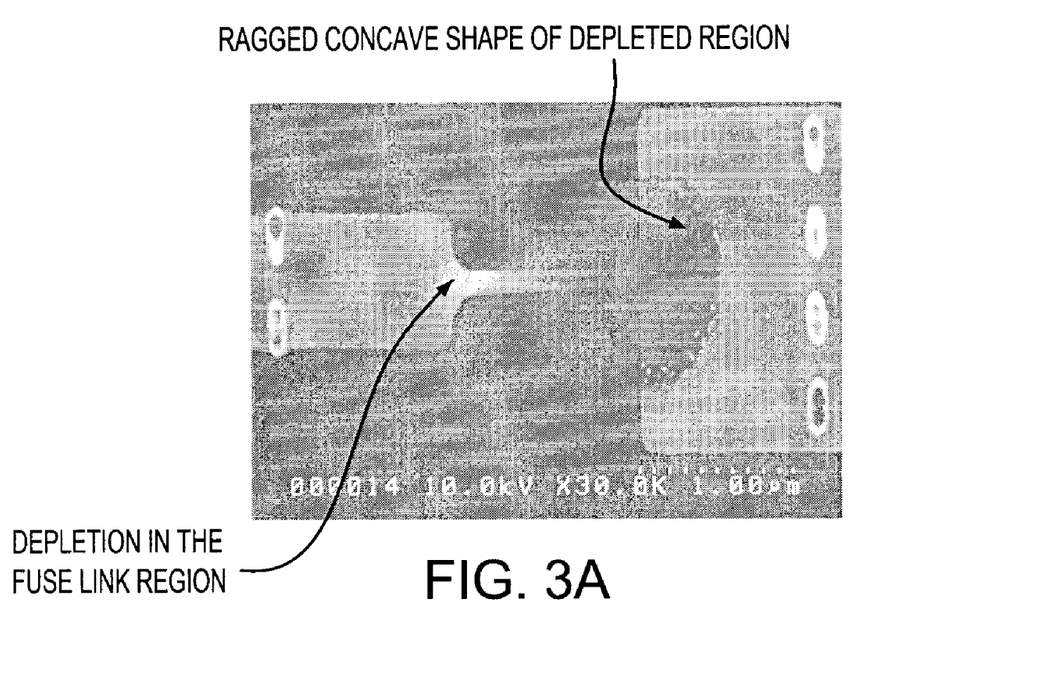
FIG. 3a and FIG. 3b show the behavior of eFuse silicide migration according to the invention when electrical polarity is reversed.
Figure 3B:
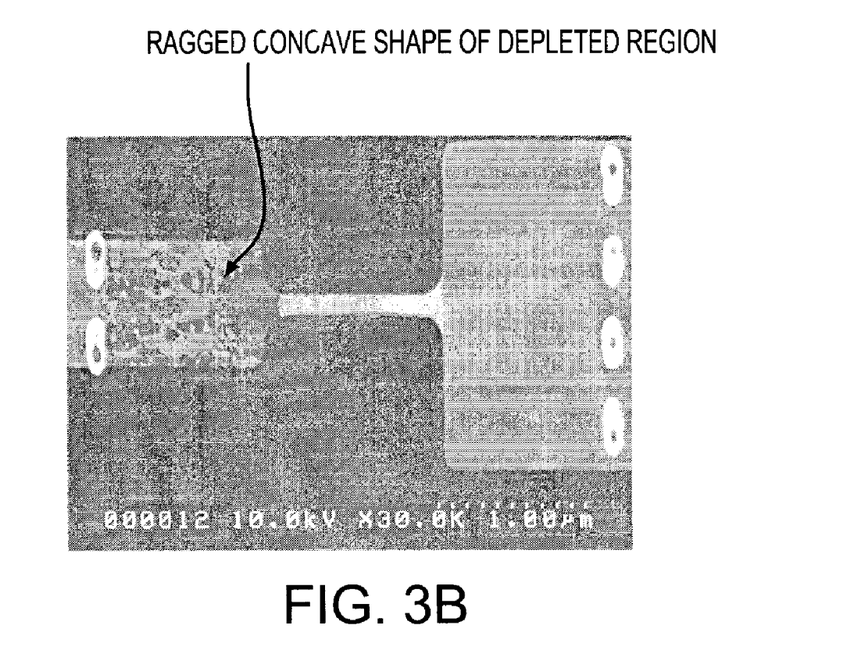

FIGS. 3a and 3b show the effects of silicide depletions when the polarities of the fuse ends are reversed. The material 40 is depleting at the cathode and accumulating at the anode, indicating that electron wind force is a strong component of material migration and a dominant process in the electromigration of the silicide. Apparently, there is no visible change in the polysilicon, indicating under the programming (stressing) condition used, there is no melting of either of the layers. The electrode shapes of the cathode and anode did not appear to change the silicide migration characteristics.

Figure 4A:
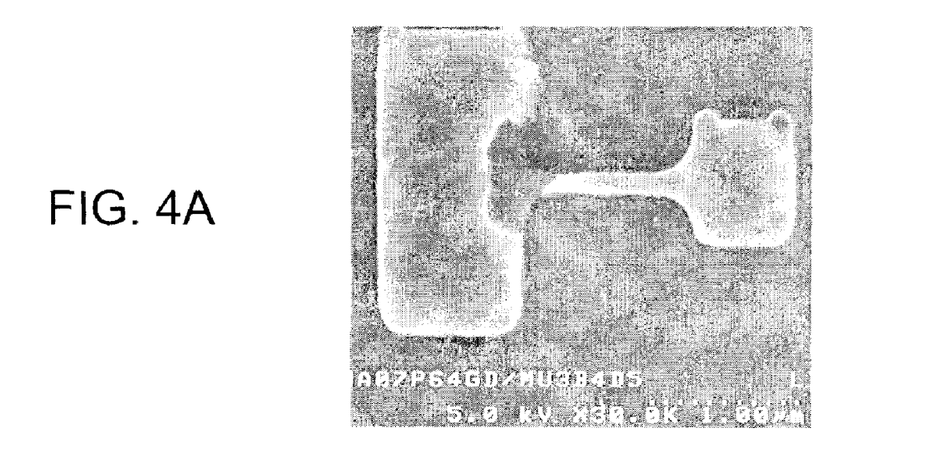
Figure 4B:
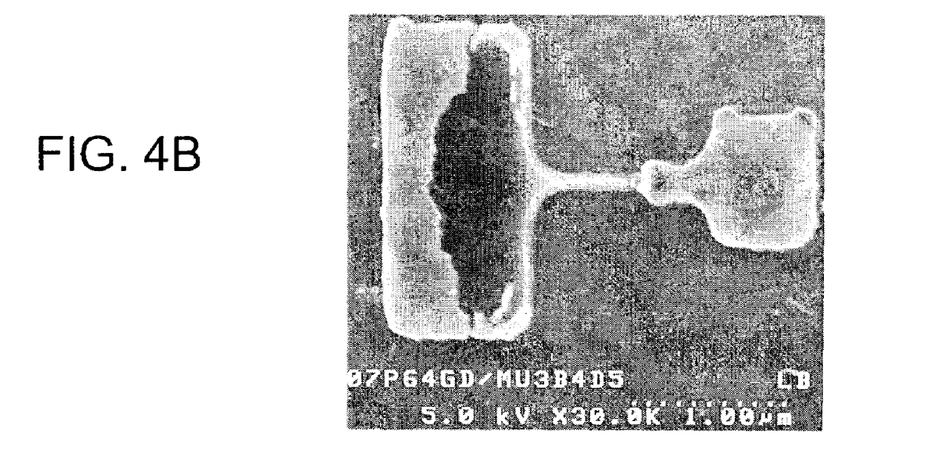

FIGS. 4a and 4b show that the migration phenomenon scales from 90 nm to 45 nm, and that electromigration appears to be a dominant mechanism. FIG. 4a shows the material 40 movement (and depletion) using a 90 nm fuse and FIG. 4b for a 45 nm fuse. Both fuses have the same thickness, fuse link length and are programmed under the same conditions. The 45 nm fuse (FIG. 4b) showed more extensive but similar type of suicide electromigration.

Figure 5:
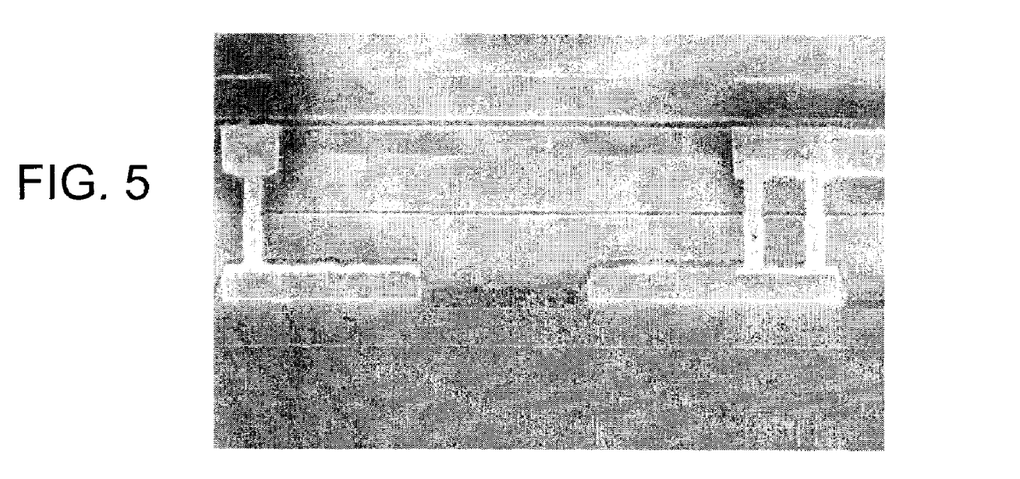
FIG. 5 is a side cross sectional view of an eFuse implementation using nickel silicided gates and a low k insulator.

FIG. 5 shows a cross section of a Nickel silicide fuse, encased using a SiN layer and a low k interlevel dielectric and contact studs, which has been programmed. The cross section shows that there appears to be no damage to overlying layers.

Figure 6:
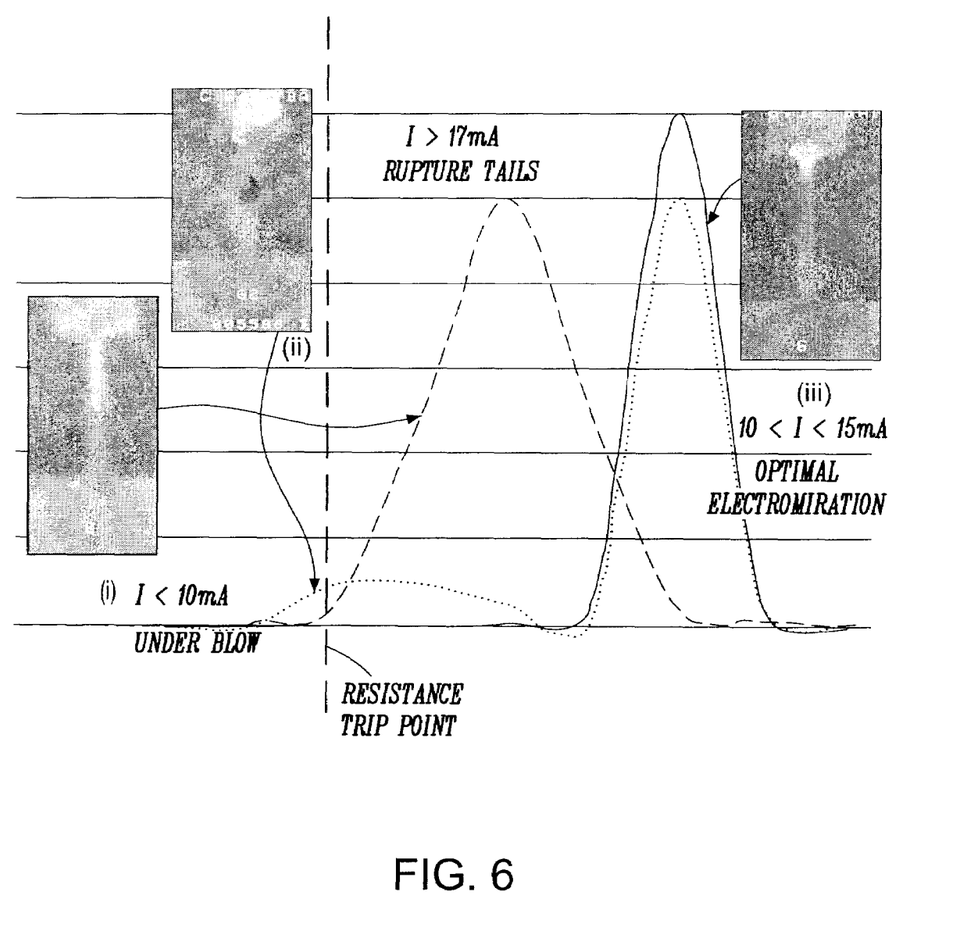
FIG. 6 is a diagram which demonstrates the role of the programming current I, by using the eFuse post-program resistance and exemplary top view fuse photographs.

FIG. 6 shows in a diagram and three SEMs the effect of the programming current I on the fuse behavior. The program pulse is typically in the 150-250 uS duration. The drawing shows the combined results of many fuses and the final programmed resistance. When a small programming current is used, in this case less than 10 mA, the resulting structure (i) shows some silicide migration and a post-program resistance distribution that is wide and on the low side (approximately 5 Kohms). By comparison, when the program current exceeds 17 mA, the fuse (ii) can rupture and the post program resistance shows a two mode distribution. One of the modes provides post-program resistance that is too low to be reliable, and also the rupturing will cause damage to the adjacent features. The other mode shows a similar distribution as the optimal current programming, suggesting that the mechanism is similar. Under optimal programming current, which in this case is 10 mA to 15 mA, the post-program resistance is high (>>5 Kohms) and tightly distributed,—i.e, a reliable eFuse behavior. (iii) Also, under this condition, the silicide has been extensively removed from the fuse link region, without any rupture. In other words, the inventors have recognized that optimal program conditions can be determined for an eFuse at a technology node, by comparing statistical post-program fuse resistance and physically observing the silicide depletion extent for the 90 nm $CoSi_2$ polySi fuse. The migration of the silcide material towards the anode and the corresponding depletion at the cathode indicates that the silicide migration is primarily caused by the electron wind (opposite to direction of programming current I). This is confirmed, for example, by reversing the current direction as shown in FIG. 3b, where the direction of silicide flow and depletion is reversed.

Figure 7:
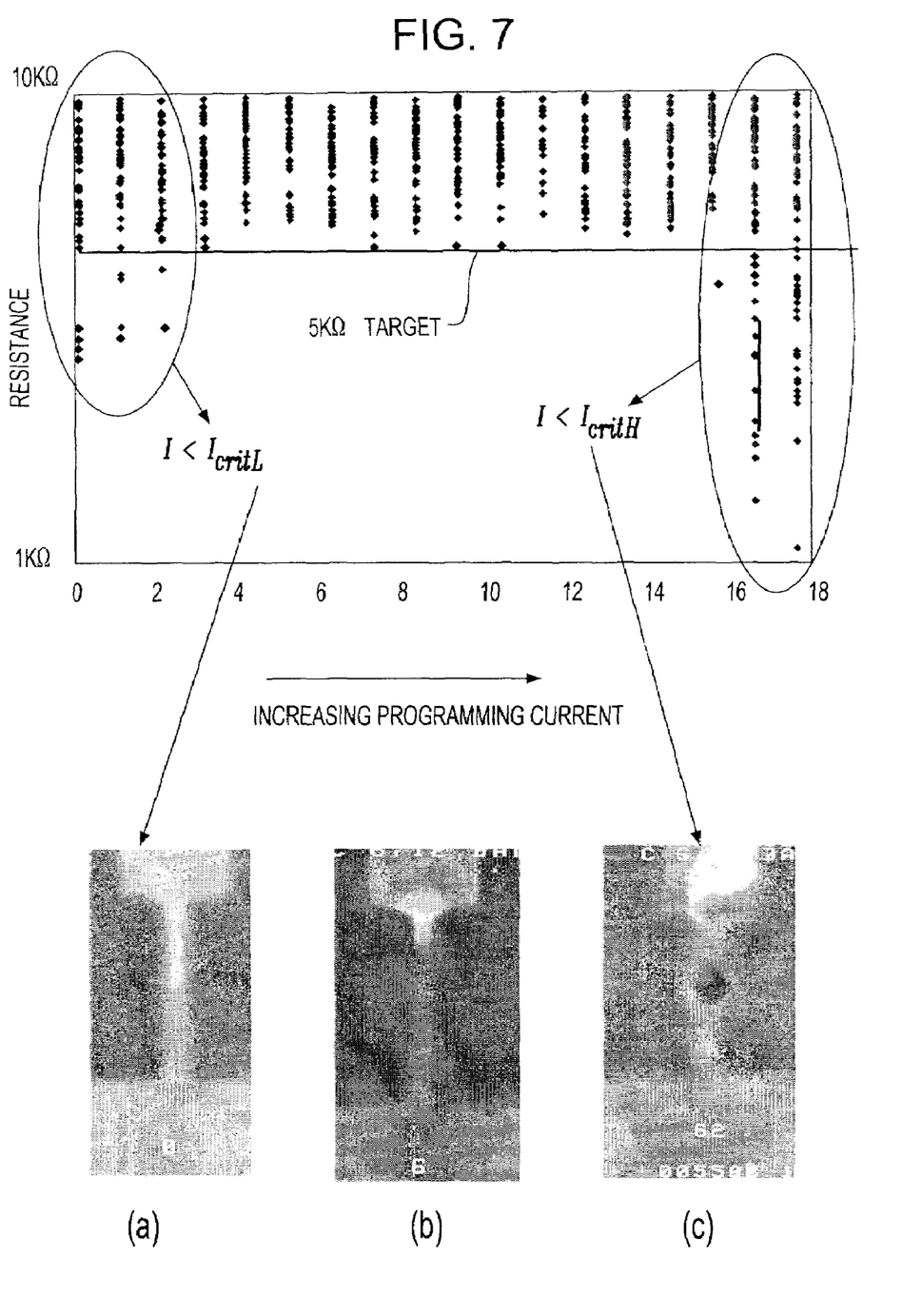
FIG. 7 is an alternate way to show in a diagram and SEMA the effect of program current on the distribution of the post-program resistance.

FIG. 7 is an alternate way to depict the same results from FIG. 6; the conclusion is that by the use of post-program resistance statistics and physical observation of the extent of silicide depletion, the range of optimal programming conditions can be determined.

Figure 8:
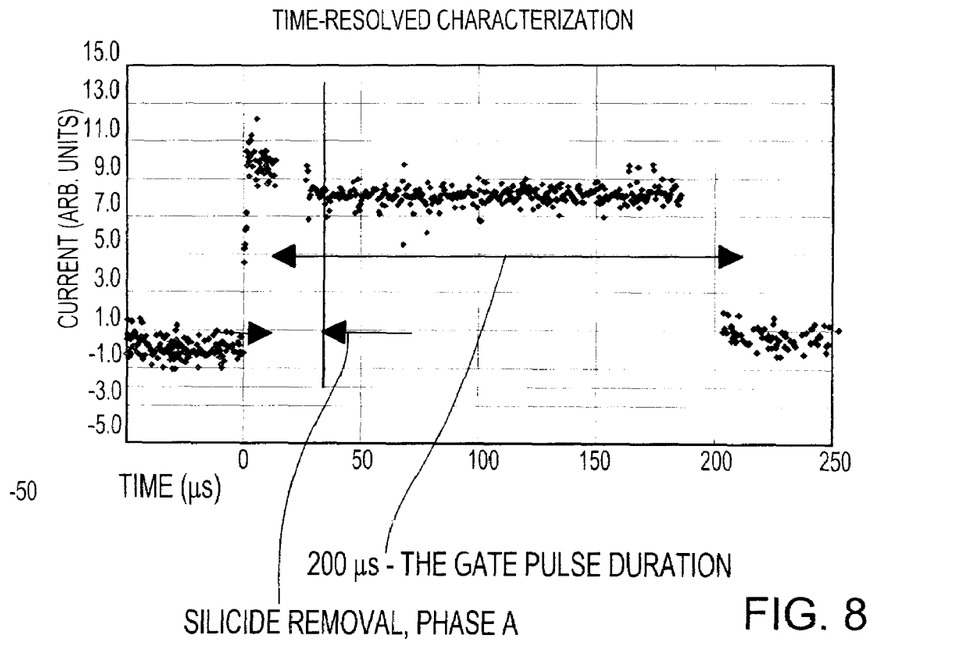
FIG. 8 is time-resolved characterization diagram of a programming cycle and the physical observation of the migratory process according to the invention.

FIG. 8 shows a time resolved characterization diagram of eFuse behavior under a preferred programming cycle. This has been crucial to the inventors' belief of how the parameters affect the fuse behavior. Silicide removal starts very early in the cycle and continues through the entire cycle increasingly depleting the fuse link and the cathode regions. Even more importantly is that the fuse blow current seems to be maintained even after the silicide depletion has caused a physical separation i.e—a break in the silicide layer 40 in the fuse link region. The present inventors surmise that the polysilicon continues to support conducting current through the entire cycle, causing additional migration of silicide material from the cathode to anode. However, once the programming is ended, the final resistance is quite high indicating that the polysilicon now must have become a higher resistance suggesting that most of the dopants have been removed from the fuse (dopant concentration reduced by 1-2 or more orders of magnitude) during the programming cycle. Based on an observation that current flow did not stop prior to ending the programming cycle, the inventors have concluded that the current conduction is enabled by the low resistance of the hot polysilicon 12.

Figure 9:
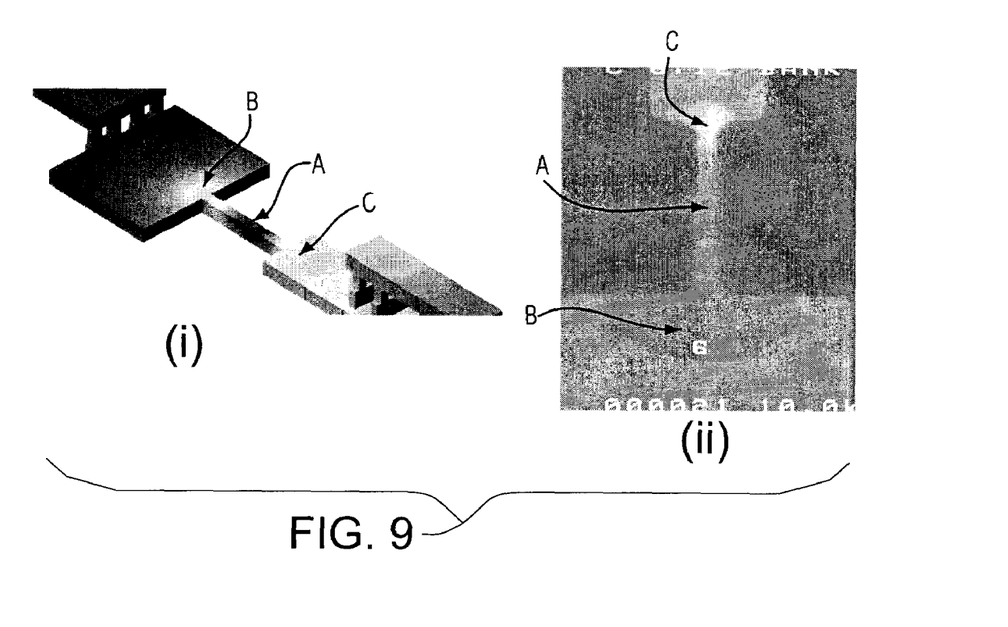
FIG. 9 is a possible model of the inventive fuse using a thermal simulation and a corresponding SEM.

FIG. 9 shows a finite element modeling diagram and an SEM of the fuse indicating that the hottest region is in the middle of the fuse link (region A) and the temperatures become progressively less hot as one travels closer to the fuse ends. However, extensive depletion occurs at location "B" in the cathode part suggesting that large current divergence is present in location "B". The material 40 piles up or collects in the region "C" and the major portion of the fuse link remains depleted. As long as the program cycle is on, the hot polysilicon supports the current and the silicide material 40 migrates from the cathode region to the anode region.

Figure 10:
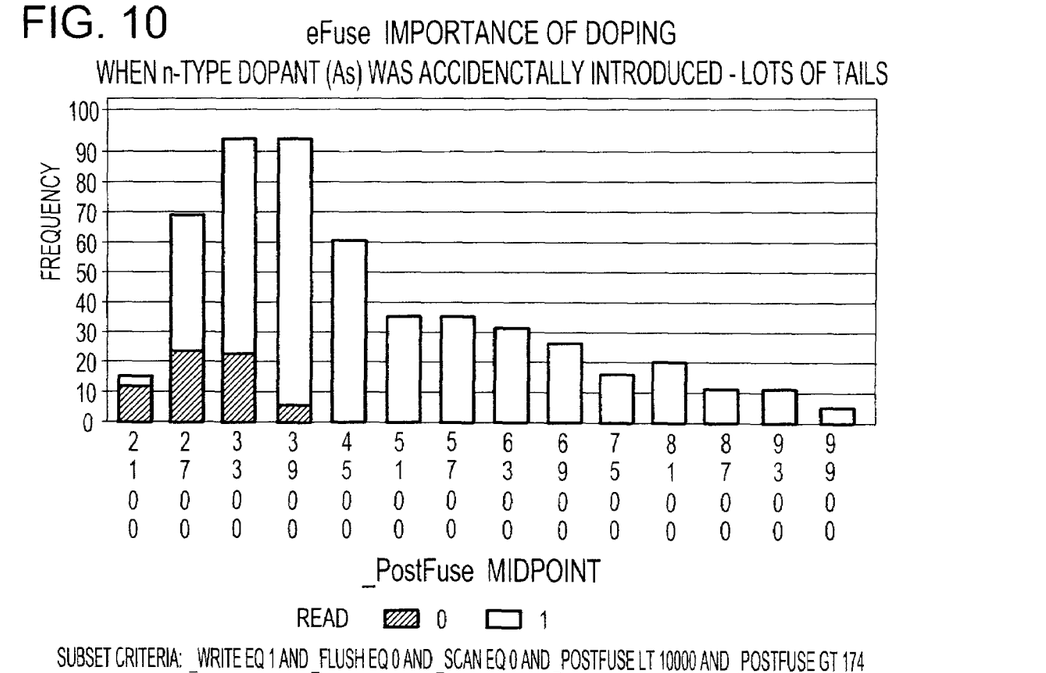
FIG. 10 is a diagram which shows one possible effect between dopants in the polysilicon and the post-program resistance distribution.

FIG. 10 shows the effect of post-program resistance when a fuse lot had both types of polysilicon underlayers, one with n type dopants and the other with p type dopants. Under the same programming conditions, the n doped fuses have lower post-program resistance than the p doped fuses. The present inventors speculate that the n dopants are not swept out of the fuse link region as effectively due to the higher mass of n dopant (As) as compared to p dopant (B). It is also possible that electromigration stress acts more strongly on the p dopant, as the electric field and electron wind are in the same direction, whereas the electric field and electron wind might work against each other for the n dopant. Irrespective of the explanations offered, the inventors have found that p type dopants provide a better reliable eFuse. The inventors tried to answer the next questions: if the dopants play any positive role in the eFuse behavior, or if one can obtain good results without the dopants.

Figure 11:
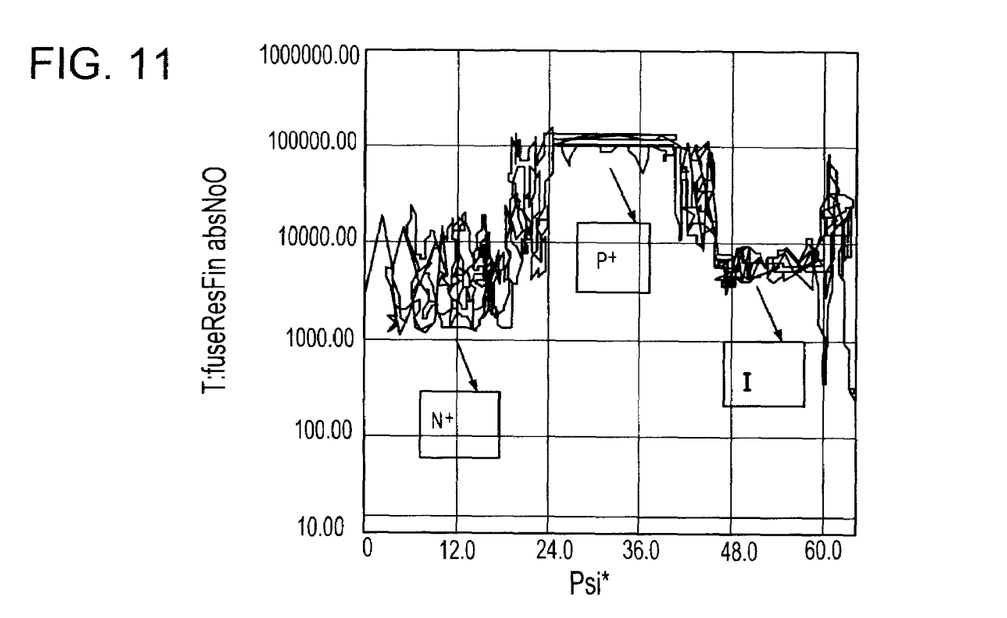
FIG. 11 shows another diagram helpful to understand the role of dopants.

FIG. 11 shows the results comparing the post program resistance for n dopant poly with p dopant poly and with intrinsic polysilicon. The results showed that the n dopants seem to show lower and large variance in values of post-program resistance. However, in the case of intrinsic polySi, even as the cluster of values occurred similar to n dopant, many fuses showed unacceptably low resistance.

Figure 12:
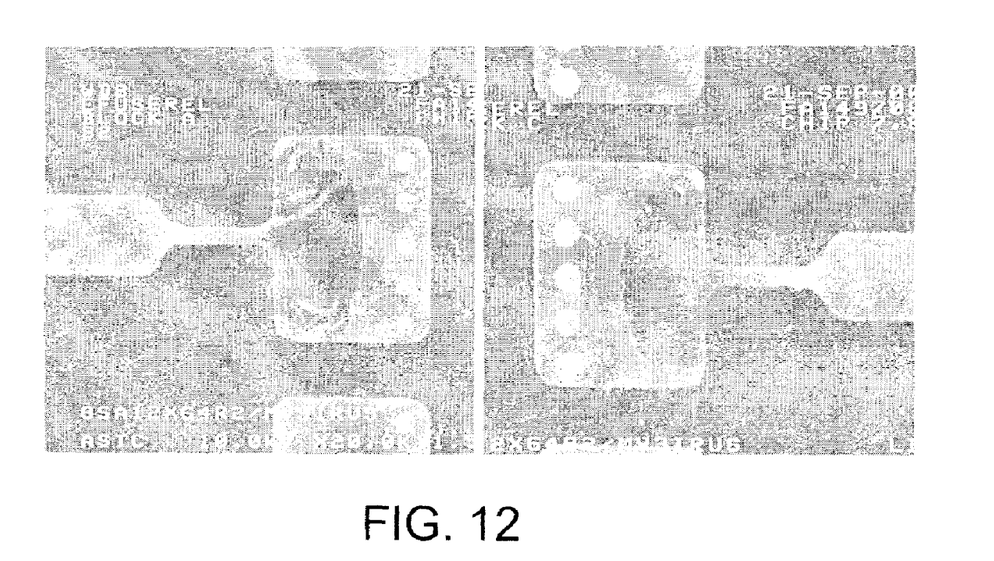
FIG. 12 is a topview SEM of the programmed Fuse with different dopants according to the invention, and no dopants (un-doped).
Figure 13:
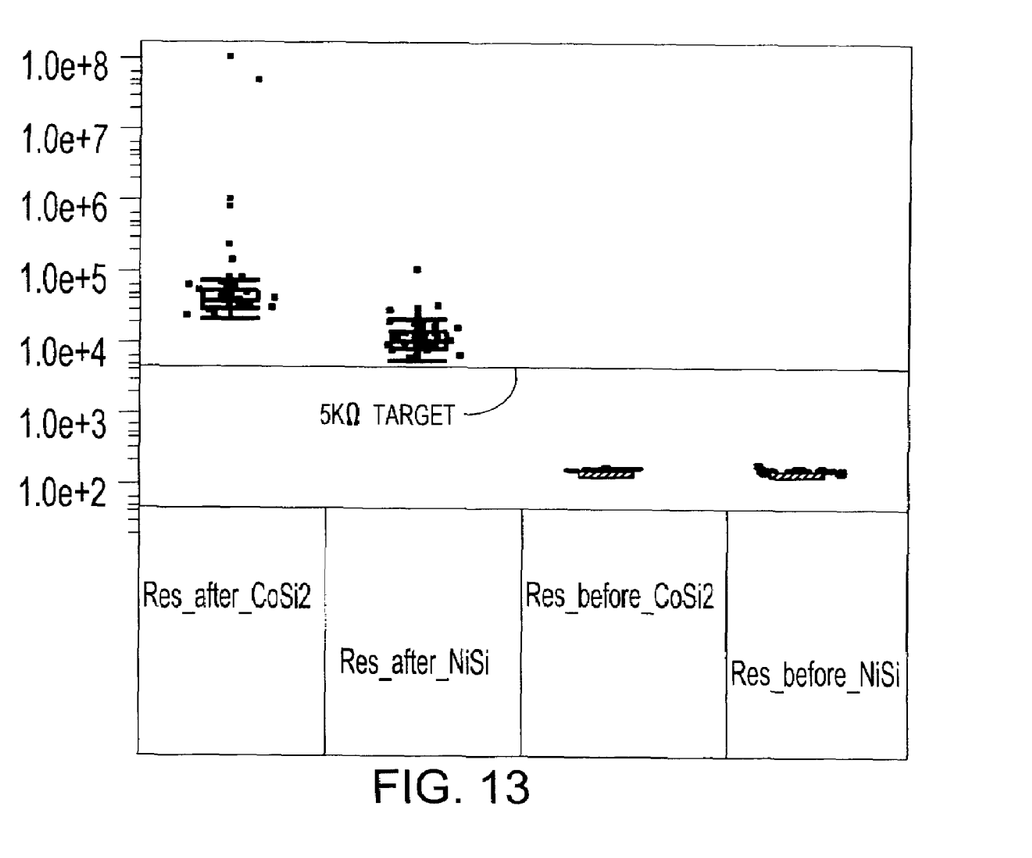
FIG. 13 is a finite element model helpful to understand the impact of fuse geometry on the thermal characteristics.

FIG. 12 shows that, in the case of intrinsic polySi (Undoped Poly), the silicide migration has become very unpredictable, and strands of silicide material seem to remain behind as compared to cleaner migration in the case n and p dopants. It is speculated that in the case of intrinsic polySi, the absence of dopants changes the time resolved current division between polySi and silicide, interfering with complete silicide removal from the fuse link region.

Figure 14A:
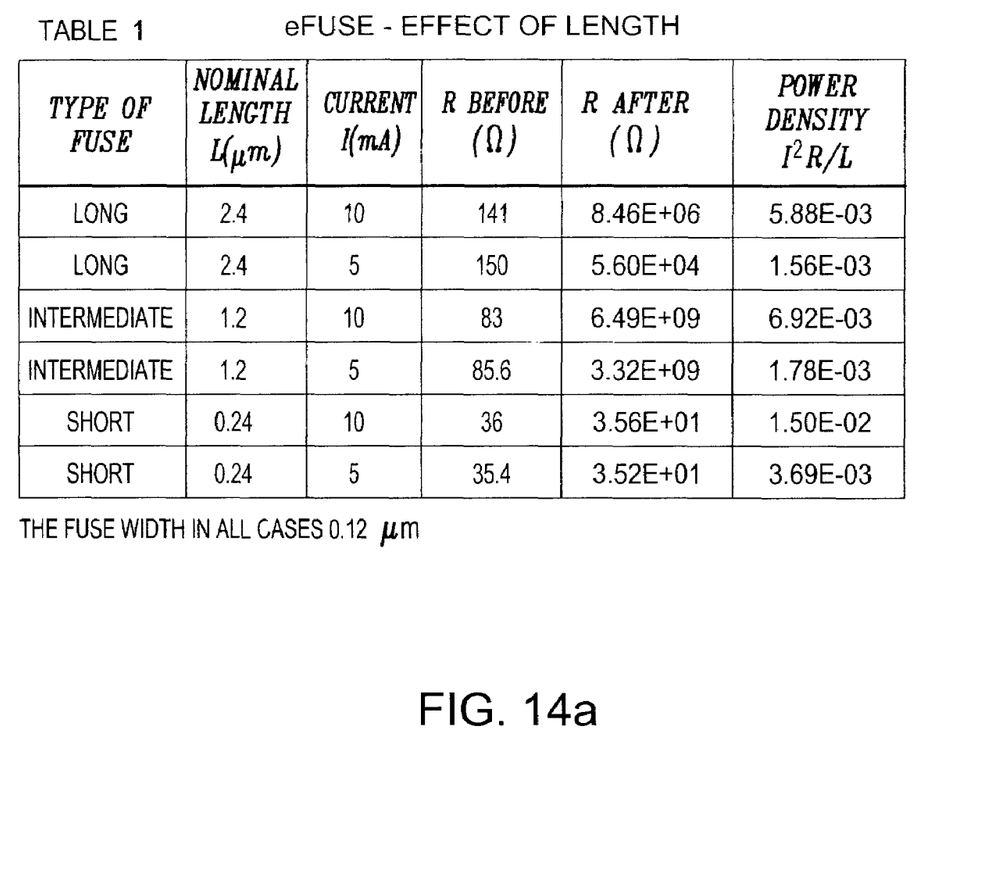
FIG. 14a—Table 1 is a summary of different geometries, program current and before and after program resistance.

Using the finite element model of FIG. 9, the impact or influence of fuse link length is examined for three different fuse lengths and at two different current densities; and the thermal characteristics are compared with fuse programming results of actual samples, as listed in Table 1 (FIG. 14a). Table 1 lists the data for the three cases of fuse link length L; short (2 times the width, i.e area is 2 squares), intermediate (10 squares) and long (20 squares). The fuse cross sections are kept the same in all three cases. Two different programming current were used in the model. The finite element model results showed that the temperature in the middle of the fuse link increases from 2 squares to 5 and then somewhat to 10 but does not change beyond that, suggesting short fuses have strong thermal sinking effect from the large area terminal ends. The model was compared with experimental results. The initial resistances of the fuses scale with length. The power density for unit length was calculated using initial resistances and program current, to see if it plays any role in the post-program resistance results. The post program fuse resistance was not sufficiently changed for the short fuses, showing that the temperature in the fuse link part must have been too low and resulted in incomplete silicide migration and low post-program resistance. The very long fuses showed higher resistance values but the final resistance showed a large scatter. The inventors speculate that when a long fuse link is available, the electromigration depletion can statistically start in more than one spot and grow, leading to cases where clean depletion of the fuse link region did not materialize. When the fuse length is in the range of 5 to 15 squares, the statistical distribution is reduced and the fuse link region becomes adequately hot to support the physical process proposed by the inventors earlier.

Figure 14B:
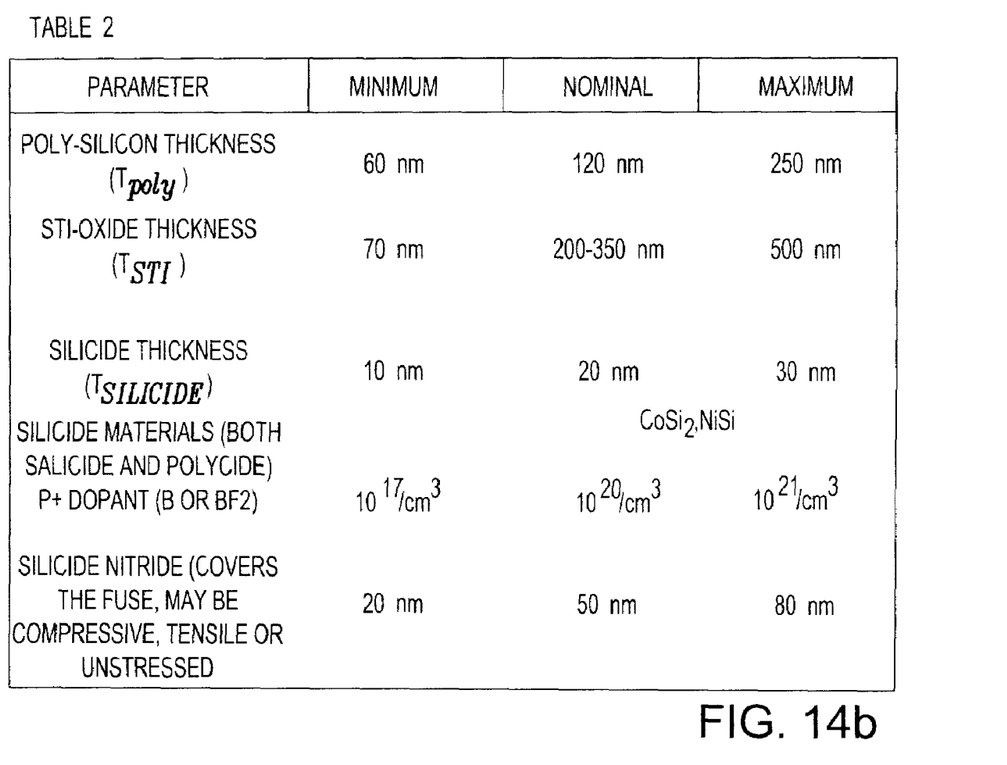
FIG. 14b—Table 2 lists the thickness ranges of different layers of the eFuse of FIGS. 2a and 2b, and the preferred dopants in accordance with the present invention.
Figure 14C:
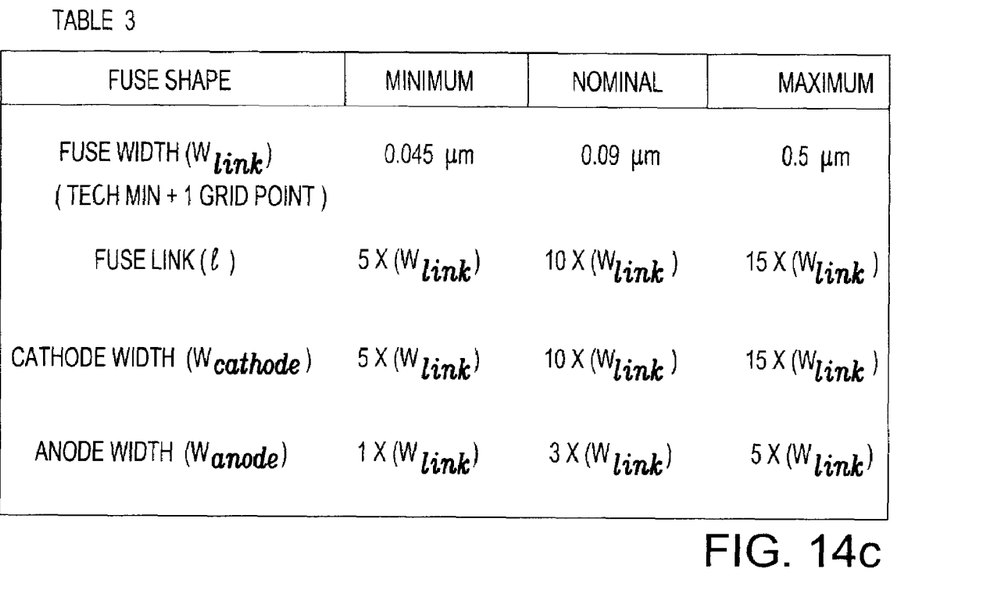
FIG. 14c—Table 3 lists various length and width dimensions of the eFuse of FIGS. 2a and 2b in accordance with the present invention.

The inventors have studied fuses with ranges of thicknesses for polysilicon and silicide that can be used to build a reliable eFuse, listed in Table 2 (FIG. 14b). The dopant concentration in the polysilicon can be in the range of $10*17/cc$ to $10*21/cc$ and preferably of the 'p' type. A dopant level lower than $10*17/cc$ will produce too high an initial resistance approaching the behavior observed when intrinsic polysilicon is used. Once a set of thicknesses is chosen, the device manufacturing will introduce some variability but that is typically much less than the range provided in the table. The STI (shallow trench isolation) oxide thickness in the higher range is more consistent with CMOS device practice; however, the minimum is based on the thermal heat sink characteristic of the Si substrate. Below 70 nm, the fuse is too close to the substrate, which can effectively cool down the fuse and prevent reliable programming. Table 3 (FIG. 14c) lists fuse link widths and lengths, for designing a reliable eFuse based on the experimentation, modeling and belief. The minimum fuse width is typically the lithography minimum feature in the technology node, but based on the present work, a maximum width is suggested since random electromigration depletion can prevent obtaining a clean fuse link migration. The cathode geometry and anode geometry are larger than the fuse link by many times, and the cathode is made larger to provide a large silicide source and current divergence. Based on the above information, the inventors describe hereinafter a best mode for designing, fabricating and programming a reliable eFuse.

BEST MODE FOR CARRYING OUT THE INVENTION

Using FIG. 2a and FIG. 2b, a preferred programmable (un-programmed) semiconductor device (1) (e.g. fuse) can be described. The fuse (1) includes an elongated semiconductor material (12) having a metallic material (40) disposed on an upper surface S. The material (12) is disposed on/over an isolation region (13) in or on a semiconductor (eg. silicon) substrate (10). Preferably, for a CMOS logic application, this material 12 is P+polysilicon (doped with Boron with a nominal concentration of $1 \times 10^{20}/cm^3$) and with a thickness ranging from 60 nm to 250 nm and preferably 150 nm. The STI region (13) is filled with an insulator such as an oxide. The STI depth (oxide thickness) is preferably about 300 nm, however it could range as high as 500 nm, but has to be larger than 70 nm. The device (1) includes a first end (12a), a second end (12b) and a central portion or link (11) connecting the first end (12a) to the second end (12b). Preferably, the link (11) and the first end (12a), together, form a "T"-shaped member (FIG. 2a).

According to an important feature of the present invention, the resistivity and resistance of the metallic material (40) are much less than the resistivity and resistance of the semiconductor line (12). Preferably, the resistivity of the material (40) is in a range of approximately (±10%) 6 ohms per square to 12 ohms per square, while the resistivity of the line (12) is in a range of approximately 250 ohms per square to 350 ohms per square (P+polysilicon).

Preferably, the resistivity of the material (40) and the line (12) in combination has an effective resistivity of 7 ohms per square to 13 ohms per square for logic.

During programming, i.e., under suitable current, voltage and time conditions, the material (40) migrates from the first end (12a) and the link (11), to a location proximate to the second end (12b) and accumulates; in addition, the heat generated in the semiconductor material makes it conducting and thus enables continued conduction of the current and continued movement of silicide in the direction of electron flow, even as the silicide becomes discontinuous. During this process, the dopants in the semiconductor are removed via electromigration in the direction of the current towards the second end (12b) as well as segregated into the STI region (13).

Using the methodology described earlier in conjunction with FIG. 6 and FIG. 7, an optimal programming current I is determined, which for the fuse described here is about 10 mA. The silicide was found to be depleted at the cathode end and the dopants were removed in the same region. This results in a large post-programming resistance. The programming window was found to be compliant between 150 μS and 350 μS for this given technology. It was further determined that the fuse power and time scale with the technology feature, affording an electrical fuse that is reusable at nano scale technology nodes. However, this places a design guideline for the maximum programming current allowed for the desired programming via electromigration. These conditions are technology dependent, and can be established at the onset of technology manufacturing. Accordingly, the fuse test and evaluation process flow to determine optimum programming is an additional feature of this invention. The program voltage is preferably 3.3 Volts, even though up to 5V can be used with the CMOS logic devices.

While there has been shown and described what is at present considered a preferred embodiment of the present invention, it will be readily understood by those skilled in the art that various changes and modification may be made therein without departing from the spirit and scope of the present invention which shall be limited only by the scope of the claims.

INDUSTRIAL APPLICABILITY

The present invention has applicability as E-fuses that may be employed during chip production, or within a deployed system to repair failing circuitry, or to customize a hardware or software application.

What is claimed is:

1. A programmable device for reliably achieving a post-programming resistance greater than 5 Kohms, said programmable device comprising:
   a substrate;
   an insulator on said substrate;
   an elongated semiconductor material having a constant first thickness and disposed on said insulator, said elongated semiconductor material having a first end, a second end, a fuse link between the ends, and an upper surface;
   a metallic material having a constant second thickness and disposed on said upper surface; and
   at least one programming transistor configured to supply an electrical current, I, having a magnitude between a first value and a second value through said elongated semiconductor material and through said metallic material;
   wherein said semiconductor material includes a dopant of one conductivity type at a concentration of at least $10^{17}$ dopants/cc, said first end is wider than said second end, and said metallic material being physically migratable along said upper surface responsive to said electrical current;
   wherein said first value is set between a first range of current level that causes post-program resistance distribution that is wide and on a low side of approximately 5 Kohms and a second range of current level that causes said post-program resistance to be greater than 5 Kohms and tightly distributed without any rupture in said elongated semiconductor material;
   wherein said second value is set between said second range of current level and a third range of current level that ruptures said elongated semiconductor material and said post-program resistance shows a two mode distribution; and
   wherein said at least one programming transistor comprises:
   a first programming transistor having a first terminal, a second terminal, and a first gate electrode, wherein said first terminal is connected directly to said second end of said elongated semiconductor material, and wherein said first gate electrode is connected to a power supply voltage, Vdd; and
   a second programming transistor having a third terminal, a fourth terminal, and a second gate electrode, wherein said third terminal is directly connected to said second terminal, and said second gate electrode is configured to be pulsed with a programming signal to provide said electrical current, I.

2. A programmable device, comprising:
   a substrate;
   an insulator on said substrate;
   an elongated semiconductor material having a constant first thickness and disposed on said insulator, said elongated semiconductor material having a first end, a second end, a fuse link between the ends, and an upper surface;

a metallic material having a constant second thickness and disposed on said upper surface;

a first programming transistor having a first terminal, a second terminal, and a first gate electrode, wherein said first terminal is connected directly to said second end of said elongated semiconductor material, and wherein said first gate electrode is connected to a power supply voltage, Vdd;

a second programming transistor having a third terminal, a fourth terminal, and a second gate electrode, wherein said third terminal is directly connected to said second terminal, and said second gate electrode is configured to be pulsed with a programming signal, wherein said programming signal supply an electrical current, I, through said elongated semiconductor material and through said metallic material;

wherein said semiconductor material includes a dopant of one conductivity type at a concentration of at least $10^{17}$ dopants/cc, said first end is wider than said second end, and said metallic material being physically migratable along said upper surface responsive to said electrical current.

3. The programmable device of claim 2, wherein said electrical current, I, is between a first value and a second value, wherein said first value is set between a first range of current level that causes a post-program resistance distribution that is wide and on a low side of approximately 5 Kohms and a second range of current level that causes said post-program resistance to be greater than 5 kohms and tightly distributed without any rupture in said elongated semiconductor material; and wherein said second value is set between said second range of current level and a third range of current level that ruptures said elongated semiconductor material and said post-program resistance shows a two mode distribution.

* * * * *